(12) United States Patent
Han

(10) Patent No.: US 12,259,778 B2
(45) Date of Patent: Mar. 25, 2025

(54) MEMORY SYSTEM DETERMINING A DEGRADED WORD LINE BASED ON FAIL BIT COUNT AND OPERATING METHOD THEREOF

(71) Applicant: SK hynix Inc., Icheon (KR)

(72) Inventor: Gi Bbeum Han, Icheon (KR)

(73) Assignee: SK Hynix Inc., Icheon (KR)

( * ) Notice: Subject to any disclaimer, the term of this patent is extended or adjusted under 35 U.S.C. 154(b) by 213 days.

(21) Appl. No.: 18/051,767

(22) Filed: Nov. 1, 2022

(65) Prior Publication Data

US 2023/0376370 A1 Nov. 23, 2023

(30) Foreign Application Priority Data

May 20, 2022 (KR) .................. 10-2022-0062172

(51) Int. Cl.
*G06F 11/07* (2006.01)
*G11C 29/02* (2006.01)
*G11C 29/08* (2006.01)
*G11C 29/44* (2006.01)
*G11C 29/52* (2006.01)

(52) U.S. Cl.
CPC .......... *G06F 11/076* (2013.01); *G06F 11/073* (2013.01); *G11C 29/025* (2013.01); *G11C 29/08* (2013.01); *G11C 29/44* (2013.01); *G11C 29/52* (2013.01)

(58) Field of Classification Search
None
See application file for complete search history.

(56) References Cited

U.S. PATENT DOCUMENTS

| 9,384,805 B1 | 7/2016 | Lee et al. | |
| 2002/0114198 A1* | 8/2002 | Kato | G11C 29/787 365/200 |
| 2002/0176302 A1* | 11/2002 | Jung | G11C 11/4094 365/222 |
| 2004/0264289 A1* | 12/2004 | Jacunski | G11C 7/1072 365/233.1 |
| 2009/0040851 A1* | 2/2009 | Mori | G11C 29/12015 365/201 |
| 2014/0198589 A1* | 7/2014 | Mok | G11C 11/4076 365/189.11 |
| 2017/0155382 A1* | 6/2017 | Lee | G11C 11/4094 |

FOREIGN PATENT DOCUMENTS

KR 10-2006-0111220 A 10/2006
KR 10-2015-0098121 A 8/2015

\* cited by examiner

*Primary Examiner* — J. H. Hur

(57) ABSTRACT

A memory system and an operating method thereof perform word line verification by deactivating each of a plurality of word lines at the same time as initiating a bit line equalization, determine a fail bit count for each word line according to a number of bit flips that occurred during the word line verification, and determine a degraded word line on the basis of the fail bit counts of the plurality of word lines.

16 Claims, 23 Drawing Sheets

FIG.8

| DWL_INFO | ADD | FBC | ΔFBC1 | ΔFBC2 |

FIG.10

| | MSB | | | | | | | | | | | | | | |
|---|---|---|---|---|---|---|---|---|---|---|---|---|---|---|---|
| PT: | 1 | 1 | 0 | 0 | 1 | 1 | 0 | 0 | 1 | 1 | 0 | 0 | 1 | 1 | 0 | 0 |
| RD: | 1 | 1 | 1 | 0 | 1 | 1 | 0 | 0 | 1 | 1 | 0 | 0 | 0 | 1 | 0 | 0 |
| FB: |  |  | F |  |  |  |  |  |  |  |  |  | F |  |  |  |

FIG.21

| | FBC | 1ST CONDITION | 2ND CONDITION |
|---|---|---|---|
| WL1 | 11 | – | – |
| WL2 | 11 | O | X |
| WL3 | 9 | O | X |
| WL4 | 7 | X | – |
| WL5 | 7 | X | – |
| WL6 | 6 | X | – |
| WL7 | 4 | X | – |
| WL8 | 4 | X | – |
| WL9 | 4 | X | – |
| WL10 | 6 | X | – |
| WL11 | 13 | O | O |
| WL12 | 8 | X | – |
| WL13 | 10 | O | X |
| WL14 | 12 | O | X |
| WL15 | 12 | O | X |
| WL16 | 13 | – | – |

CNT1 : 8
CNT2 : 4

WL11 — Determined as degraded word line

FIG.22

|  | FBC | 1ST CONDITION | 2ND CONDITION |
|---|---|---|---|
| WL_1 | 11 | – | – |
| WL_2 | 11 | O | X |
| WL_3 | 9 | O | X |
| WL_4 | 7 | X | X |
| WL_5 | 7 | X | X |
| WL_6 | 6 | X | X |
| WL_7 | 4 | X | X |
| WL_8 | 14 | O | O |
| WL_9 | 4 | X | X |
| WL_10 | 6 | X | X |
| WL_11 | 13 | O | O |
| WL_12 | 8 | X | X |
| WL_13 | 10 | O | X |
| WL_14 | 12 | O | X |
| WL_15 | 12 | O | X |
| WL_16 | 13 | – | – |

CNT1 : 8
CNT2 : 4

Determined as degraded word line

FBC: 14, ΔFBC: 10

FBC: 13, ΔFBC: 5

MEMORY SYSTEM DETERMINING A DEGRADED WORD LINE BASED ON FAIL BIT COUNT AND OPERATING METHOD THEREOF

CROSS-REFERENCE TO RELATED APPLICATION

The present application claims priority under 35 U.S.C. § 119(a) to Korean Patent Application No. 10-2022-0062172 filed on May 20, 2022, which is incorporated herein by reference in its entirety.

BACKGROUND

1. Technical Field

Various embodiments generally relate to a memory system and an operating method thereof.

2. Related Art

A memory system includes a data storage device that stores data on the basis of a request from a host, such as a computer, servers, a smartphone, a tablet PC, or other electronic devices. The examples of the memory system span from a traditional magnetic-disk-based hard disk drive (HDD) to a semiconductor-based data storage device such as a solid state drive (SSD), a universal flash storage (UFS) device, or an embedded MMC (eMMC) device.

The memory system may further include a memory controller for controlling a memory device. The memory controller may receive a command from the host and, on the basis of the received command, may control read/write/erase operations on the memory devices in the memory system. The memory controller may be used to execute firmware operations for performing a logical operation for controlling such operations.

In a memory device, a progressive word line failure may occur due to high heat applied during a manufacturing process for a memory system module or a host workload. Memory cells of a word line in which a failure has occurred may be replaced with memory cells of a redundancy word line.

SUMMARY

Various embodiments are directed to providing a memory system for detecting a degraded word line, and an operating method thereof.

In an embodiment, a method for operating a memory system may include: performing a word line verification by deactivating each of a plurality of word lines and at the same time performing a bit line equalization in a memory cell array in which the plurality of word lines and a plurality of bit lines intersect with each other; counting a fail bit count as a number of bit flips occurred in the word line verification; and determining a degraded word line on the basis of fail bit counts of the plurality of word lines.

In an embodiment, a memory system may include: a memory device including a plurality of word lines, a plurality of bit lines and a memory cell array in which the plurality of word lines and the plurality of bit lines intersect with each other; and a memory controller configured to perform a word line verification on each of the plurality of word lines by deactivating each of the plurality of word lines and at the same time performing a bit line equalization, count a fail bit count as a number of bit flips occurred in the word line verification, and determine a degraded word line on the basis of fail bit counts of the plurality of word lines.

According to the embodiments of the disclosed technology, it is possible to determine a degraded word line among a plurality of word lines included in a memory device.

BRIEF DESCRIPTION OF THE DRAWINGS

FIG. 8 illustrates degraded word line information according to an embodiment of the disclosed technology.

FIG. 10 illustrates a comparison between a preset pattern and data read from a word line according to an embodiment of the disclosed technology.

FIG. 21 illustrates whether respective word lines satisfy a first condition and a second condition according to an embodiment of the disclosed technology.

FIG. 22 illustrates a degraded word line determined according to an embodiment of the disclosed technology.

DETAILED DESCRIPTION

Figure 1:
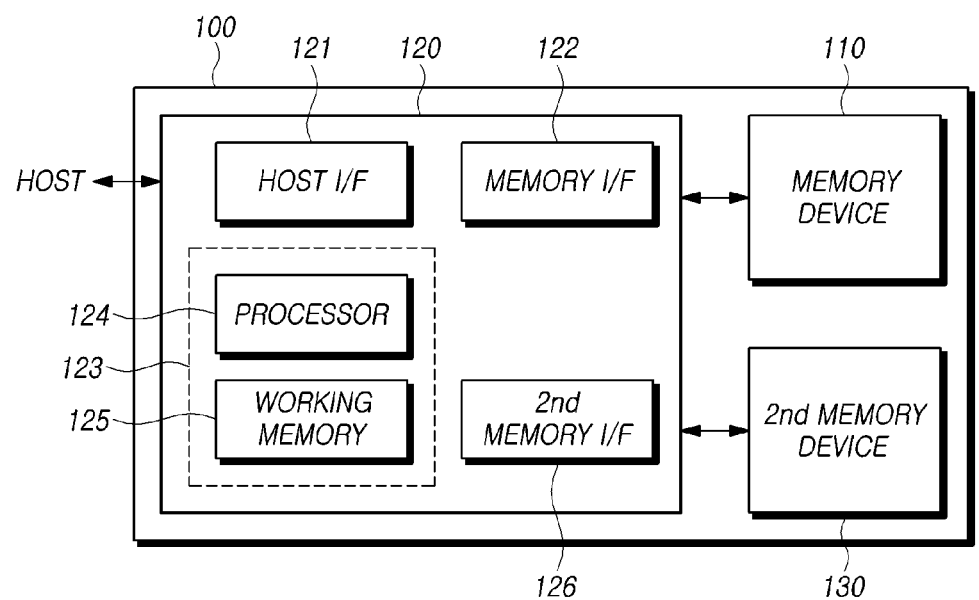
FIG. 1 illustrates a configuration of a memory system according to an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed using code or instructions executed by a computer, processor, controller, or other signal processing device. The computer, processor, controller, or other signal processing device may be those described herein or one in addition to the elements described herein. Because the algorithms that form the basis of the operations of the computer, processor, controller, or other signal processing device are described in detail, the code or instructions for implementing the operations of the method embodiments may transform the computer, processor, controller, or other signal processing device into a special-purpose processor for performing the methods disclosed herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a schematic diagram illustrating a configuration of a memory system 100 according to an embodiment of the disclosed technology.

The memory system 100 may include a memory device 110 and a memory controller 120.

The memory device 110 includes at least one memory cell array, and operates in response to the control of the memory controller 120. Operations of the memory device 110 may include, for example, a read operation and a write operation.

The memory cell array may include a plurality of memory cells (also simply referred to as "cells" for short).

For example, the memory device 110 may be include various types of memory such as DDR SDRAM (double data rate synchronous dynamic random access memory), LPDDR4 (low power double data rate 4) SDRAM, GDDR (graphics double data rate) SDRAM, LPDDR (low power DDR), RDRAM (Rambus dynamic random access memory), NAND flash memory, 3D NAND flash memory, NOR flash memory, resistive random access memory (RRAM), phase-change memory (PRAM), magnetoresistive random access memory (MRAM), ferroelectric random access memory (FRAM), spin transfer torque random access memory (STT-RAM), and the like, and combinations thereof.

The memory device 110 is configured to receive a command and an address from the memory controller 120 and access a region of the memory cell array which is selected by the address. In other words, the memory device 110 may perform an operation corresponding to the command on the region selected by the address.

The memory controller 120 may control the operation of the memory device 110 according to a request of a host. The memory controller 120 may also control the operation of the memory device 110 on its own initiative, regardless of a request of the host.

The memory controller 120 and the host may be devices which are separated from each other. Alternatively, the memory controller 120 and the host may be implemented as a single integrated device. Hereunder, for the sake of convenience in explanation, an example will be described in which the memory controller 120 and the host are separate devices.

Referring to FIG. 1, the memory controller 120 may include a memory interface 122, a control circuit 123, and a host interface 121.

The host interface 121 provides an interface for communication with the host. When receiving a command from the host, the control circuit 123 may receive the command through the host interface 121, and may process the received command.

The memory interface 122 is coupled to the memory device 110 to provide an interface for communication with the memory device 110. That is to say, the memory interface 122 may be configured to provide an interface between the memory device 110 and the memory controller 120 in response to the control of the control circuit 123.

The control circuit 123 performs the general control operation of the memory controller 120 to control the operation of the memory device 110. To this end, for example, the control circuit 123 may include at least one of a processor 124 and a working memory 125.

The processor 124 may control the general operation of the memory controller 120, and may perform a logic calculation. The processor 124 may communicate with the host through the host interface 121, and may communicate with the memory device 110 through the memory interface 122.

The processor 124 may control the operation of the memory controller 120 by executing firmware. Namely, in order to control the general operation of the memory controller 120 and perform logic calculations, the processor 124 may execute firmware loaded into the working memory 125 upon booting.

In embodiments, such firmware may be stored in a second memory device 130 to be described below and be then loaded into the working memory 125.

The working memory 125 may store firmware, program code, a command, and data which are necessary to operate the memory controller 120. Such a working memory 125 may be, for example, a volatile memory including at least one among an SRAM (static RAM), a DRAM (dynamic RAM) and an SDRAM (synchronous DRAM).

The above-described components 121, 122, 124 and 125 of the memory controller 120 are for illustrative purposes only. Some of the above-described components 121, 122, 124 and 125 of the memory controller 120 may be omitted, or some of the above-described components 121, 122, 124 and 125 of the memory controller 120 may be integrated into a single component. In embodiments, in one or more other components may be added to the above-described components 121, 122, 124 and 125 of the memory controller 120.

The memory system 100 according to the embodiment of the disclosed technology may further include the second memory device 130.

The second memory device 130 may include a plurality of nonvolatile memories, and may mainly store data inputted by a user. Also, the second memory device 130 may store information on a degraded word line and various data necessary for determining the degraded word line.

The memory controller 120 may further include a second memory interface 126.

The second memory interface 126 is coupled to the second memory device 130 to provide an interface for communication with the second memory device 130. That is to say, the second memory interface 126 may be configured to provide an interface between the second memory device 130 and the memory controller 120 in response to the control of the control circuit 123.

Hereinbelow, the memory device 110 will be described in further detail with reference to FIG. 2.

Figure 2:
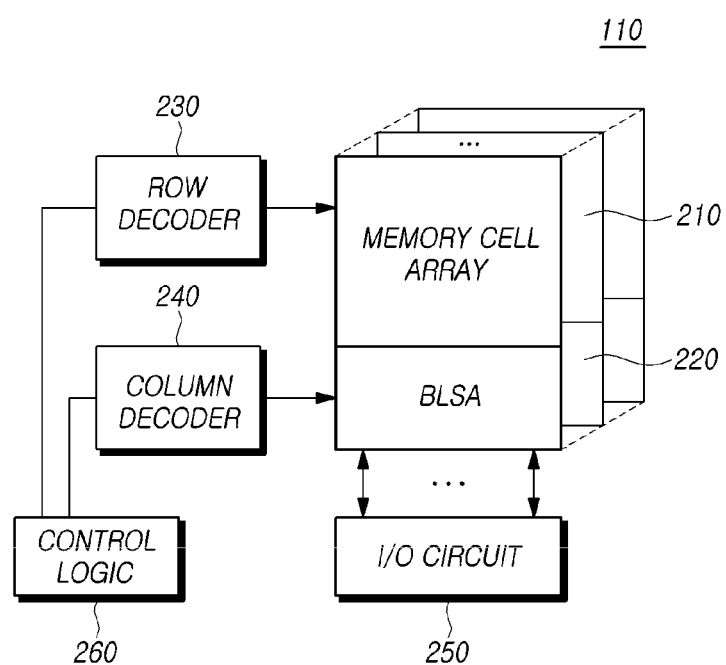
FIG. 2 illustrates a memory device according to an embodiment of the disclosed technology.

FIG. 2 is a block diagram of a memory device 110 according to an embodiment of the disclosed technology.

The memory device 110 may include at least one memory cell array 210, a bit line sense amplifier 220, a row decoder 230, a column decoder 240, an input/output circuit 250, and control logic 260.

The memory cell array 210 may include a plurality of memory cells, and each of the plurality of memory cells may store one bit value.

The bit line sense amplifier 220 corresponding to the memory cell array 210 may sense and amplify a bit line when reading data stored in a memory cell, and may drive a data input/output line which couples the bit line sense amplifier 220 and the input/output circuit 250.

The row decoder 230 may select a word line corresponding to a row of the memory cell array 210 according to a designated row address. The row decoder 230 may generate a word line driving signal for driving the selected word line.

The column decoder 240 may activate a column select signal by decoding a column address, and a plurality of bit lines may be selected according to one column select signal.

The input/output circuit 250 may include a write driver (not illustrated) and an input/output sense amplifier (not illustrated). The write driver may write input data to a memory cell in a write operation. In a read operation, the input/output sense amplifier may sense and amplify data loaded on an input/output line and output the sensed and amplified data as output data.

The control logic 260 may control peripheral circuits of the memory device 110 including the row decoder 230 and the column decoder 240 according to a command received from the memory controller 120.

The above-described components 210, 220, 230, 240, 250 and 260 of the memory device 110 are for illustrative purposes only. Some of the above-described components 210, 220, 230, 240, 250 and 260 of the memory device 110 may be omitted, or some of the above-described components 210, 220, 230, 240, 250 and 260 of the memory device 110 may be integrated into a single component. In embodiments, one or more other components may be added to the above-described components 210, 220, 230, 240, 250 and 260 of the memory device 110.

Figure 3:
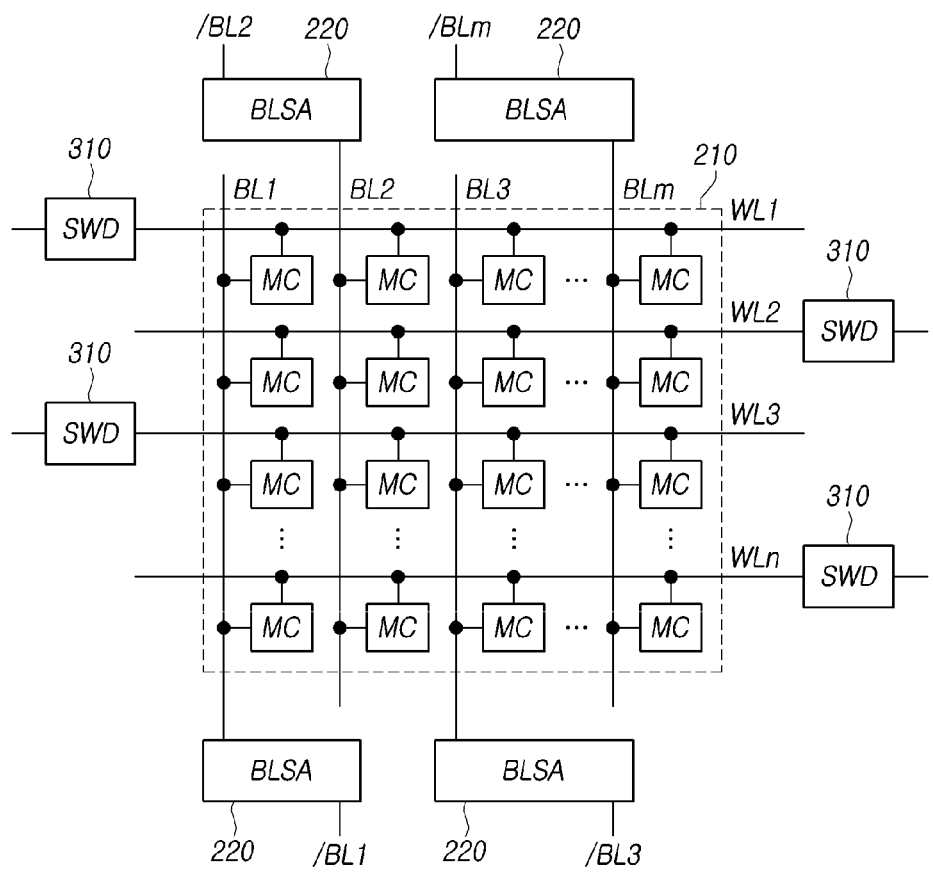
FIG. 3 illustrates a structure of word lines and bit lines of a memory device according to an embodiment of the disclosed technology.

FIG. 3 illustrates a structure of word lines and bit lines of a memory device according to an embodiment of the disclosed technology.

Referring to FIG. 3, the memory device 110 may include a plurality of word lines WL1 to WLn and a plurality of bit lines BL1 to BLm. In the memory cell array 210 included in the memory device 110, the plurality of word lines WL1 to WLn and the plurality of bit lines BL1 to BLm intersect with each other.

The plurality of word lines WL1 to WLn are coupled to a sub word line driver 310, and the sub word line driver 310 may drive a word line WL selected from among the plurality of word lines WL1 to WLn.

The plurality of bit lines BL1 to BLm may be coupled to the bit line sense amplifier 220. The bit line sense amplifier 220 may sense and amplify levels of the plurality of bit lines BL to BLm.

A plurality of complementary bit lines /BL1 to /BLm corresponding to the plurality of bit lines BL1 to BLm may also be coupled to the bit line sense amplifier 220. The plurality of complementary bit lines /BL1 to /BLm may provide a reference voltage used when the bit line sense amplifier 220 senses the plurality of bit lines BL1 to BLm. The bit line sense amplifier 220 may compare levels of the plurality of bit lines BL1 to BLm and voltage levels of the plurality of complementary bit lines /BL1 to /BLm, and may amplify differences therebetween. Similarly, the plurality of bit lines BL1 to BLm may provide a reference voltage when the plurality of complementary bit lines /BL1 to /BLm are sensed by the bit line sense amplifier 220.

Memory cells MC may be located at points where the plurality of word lines WL1 to WLn and the plurality of bit lines BL to BLm intersect with each other.

The sub word line driver 310 may activate the selected word line WL to provide an access to data stored in a memory cell MC. A memory cell MC corresponding to an activated word line WL may be electrically coupled to a bit line BL. A memory cell MC corresponding to a deactivated word line WL may be electrically decoupled from a bit line BL.

A memory cell MC corresponding to an activated word line WL may output stored data or store new data through a bit line BL.

A degraded word line means a word line which cannot provide a normal function, and the reliability of data stored in memory cells MC corresponding to the degraded word line may not be guaranteed. Thus, it is required to determine a degraded word line and take a follow-up action.

The sub word line driver 310 and the word line WL may be electrically coupled through a metal contact. A failure may occur in the metal contact due to various causes including heat or a workload applied to the memory device 110. When a failure occurs in the metal contact, normal activation and deactivation of the word line WL becomes more difficult.

Figure 4:
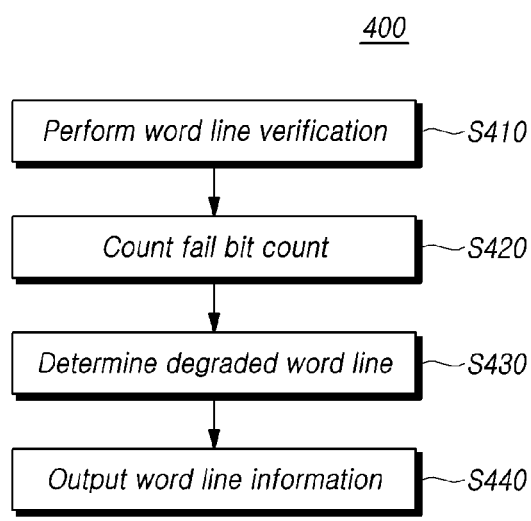
FIG. 4 is a flowchart illustrating a process for operating a memory system according to an embodiment of the disclosed technology.

FIG. 4 is a flowchart illustrating a process for operating a memory system according to an embodiment of the disclosed technology.

Referring to FIG. 4, a process 400 for operating the memory system 100 according to the embodiment of the disclosed technology may include step S410 of performing a word line verification by performing a bit line equalization at the same time as each of the plurality of word lines WL is deactivated in the memory cell array 210 in which the plurality of word lines WL and the plurality of bit lines BL intersect with each other.

In general, in order to ensure the reliability of data, after the word line deactivation is completed, bit line equalization is performed to match levels of the bit line BL and the complementary bit line /BL to a reference voltage. Bit line equalization is referred to as a bit line precharge operation in that the bit line BL and the complementary bit line /BL are charged to a voltage of a predetermined level. Usually, a timing margin is provided between the completion of word line deactivation and the start of bit line equalization.

When the memory controller 120 performs the word line verification on the plurality of word lines WL included in the memory device 110 by reducing or eliminating the timing margin between the word line deactivation and the start of bit line equalization, it is possible to check a degree to which each of the plurality of word lines WL is degraded.

The step S410 of performing the word line verification may be performed by the memory controller 120.

The process 400 for operating the memory system 100 may include step S420 of counting a number of bit flips that occurred in a word line verification to generate a fail bit count FBC.

At the step S420 of generating the fail bit count FBC, the memory controller 120 may count the number of bit flips occurred when the word line verification is performed, for each of the plurality of word lines WL. The fail bit count FBC may be used as a parameter for determining the state of a word line.

The process 400 for operating the memory system 100 may include step S430 of determining a degraded word line on the basis of fail bit counts FBC of the plurality of word lines WL.

The step S430 of determining a degraded word line may be performed by the memory controller 120.

The performing of the word line verification by deactivating a word line WL and at the same time initiating bit line equalization may also produce an overkill condition in which a bit flip occurs at the top end or bottom end of the memory cell array 210 even though the word line WL is a normal word line. The memory controller 120 may determine a degraded word line on the basis of the fail bit count FBC of each of the plurality of word lines WL. To this end, the memory controller 120 may determine whether a condition for excluding an overkill that is likely to have occurred due to the word line verification is satisfied.

The properties of the memory cell array 210 may vary as a result of a high heat applied to the memory device 110 in a process in which the memory device 110 is fabricated in a storage device module or as a result of a host workload imposed on the memory system 100. This variation in the properties of the memory cell array 210 may progress to a point where the operation of one or more word lines degrades. The process 400 for operating the memory system 100 may detect the occurrence of such a progressive failure for a word line WL of the memory cell array 210.

A degraded word line detected through the process 400 for operating the memory system 100 may subsequently be replaced with a redundancy word line.

Through this, the process 400 for operating the memory system 100 may contribute to improving the quality of the memory system 100.

The process 400 for operating the memory system 100 may further include step S440 of outputting degraded word line information.

The memory controller 120 may output the degraded word line information on a degraded word line determined through the step S420, to the outside of the memory system 100.

Through this, the memory controller 120 may provide the address of the degraded word line and the degree of degradation to the outside of the memory system 100.

Figure 5:
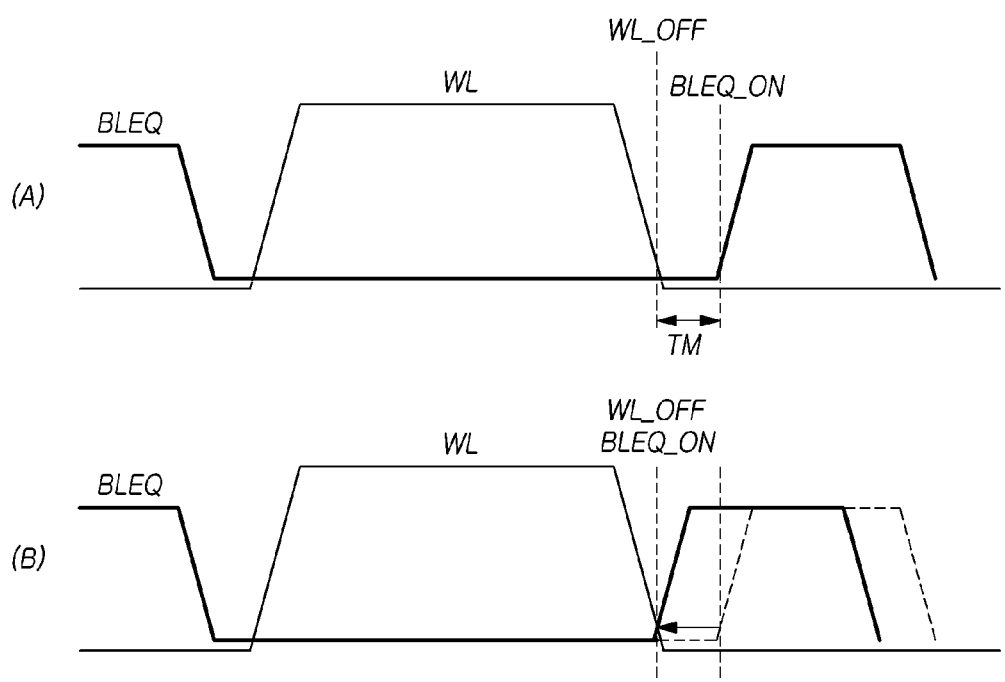
FIG. 5 illustrates word line deactivation and bit line equalization according to an embodiment of the disclosed technology.

FIG. 5 is a diagram for explaining word line deactivation and bit line equalization according to an embodiment of the disclosed technology.

Referring to FIG. 5, the memory controller 120 may detect a degraded word line by setting the bit line equalization to be performed at the same time as each of the plurality of word lines WL is deactivated (WL_OFF).

Performing the bit line equalization at the same time as each of the plurality of word lines WL is deactivated (WL_OFF) may mean that a bit line equalization signal BLEQ is activated (BLEQ_ON) at the same point in time as when each of the plurality of word lines WL is deactivated (WL_OFF). In order to determine a degraded word line, the memory controller 120 may activate (BLEQ_ON) the bit line equalization signal BLEQ at a time point earlier than the deactivation (WL_OFF) of the word line WL.

The waveforms illustrated in (A) and (B) of FIG. 5 show the word line WL of the memory device 110 and the bit line equalization signal BLEQ. In (A) of FIG. 5, after the word line WL is deactivated (WL_OFF), the activation (BLEQ_ON) of the bit line equalization signal BLEQ is performed with a timing margin TM of a predetermined time. After the word line deactivation (WL_OFF) is performed, since it corresponds to a state in which a bit line BL and a memory cell MC are electrically isolated from each other, the reliability of data stored in the memory cell MC may be ensured.

In the waveform illustrated in (B) of FIG. 5, at the same time as the word line WL is deactivated (WL_OFF) in the memory device 110, the activation (BLEQ_ON) of the bit line equalization signal BLEQ is performed without the timing margin TM. In the case of (B) of FIG. 5, since there is no timing margin TM between the word line deactivation (WL_OFF) and the activation (BLEQ_ON) of the bit line equalization signal BLEQ, the voltage level of the bit line BL may vary as a result of a bit line precharge operation according to the bit line equalization signal BLEQ which may affect the memory cell MC. At this time, in the case of a degraded word line, the cells connected to the word line may not be completely electrically isolated from the bit line when the bit line precharge operation occurs, and as result a plurality of fail bits in the form of bit flips may occur in the cells connected to the word line WL.

The memory controller 120 may enter a separate test mode to activate (BLEQ_ON) the bit line equalization signal BLEQ at the same time the word line WL is deactivated (WL_OFF).

At the step S410 of performing the word line verification, the memory controller 120 may perform detection of a degraded word line by performing the bit line equalization at the same time as each of the plurality of word lines WL is deactivated (WL_OFF).

Figure 6:
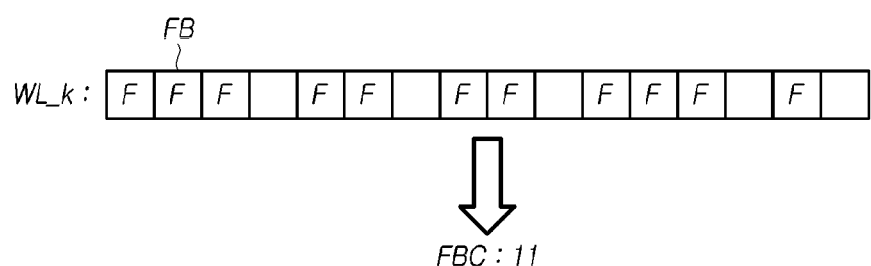
FIG. 6 illustrates bit flips occurred in one word line according to an embodiment of the disclosed technology.

FIG. 6 is a diagram illustrating bit flips occurred in one word line according to an embodiment of the disclosed technology.

Referring to FIG. 6, the memory controller 120 may count the number of bit flips that occurred during the word line verification to produce the fail bit count FBC.

The memory controller 120 may check bit flips F that occurred in the plurality of word lines WL, included in the memory device 110, through the step S410 of performing the word line verification.

In FIG. 6, the number of bit lines BL intersecting with a k-th word line WL_k in the memory cell array 210 is 16. Fail bits FB represent bit flips F occurred in memory cells MC corresponding to the k-th word line WL_k in the memory cell array 210. Locations where the bit flips F are indicated correspond to a plurality of bit lines BL, respectively.

The memory controller 120 may produce the fail bit count FBC indicating the number of bit flips F that occurred in the k-th word line WL_k. According to the illustration of FIG. 6, the number of bit flips F that occurred in the k-th word line WL_k is 11. Accordingly, the fail bit count FBC of the k-th word line WL_k is 11.

The memory controller 120 may store the fail bit count FBC for each of the plurality of word lines WL in the second memory device 130.

Figure 7:
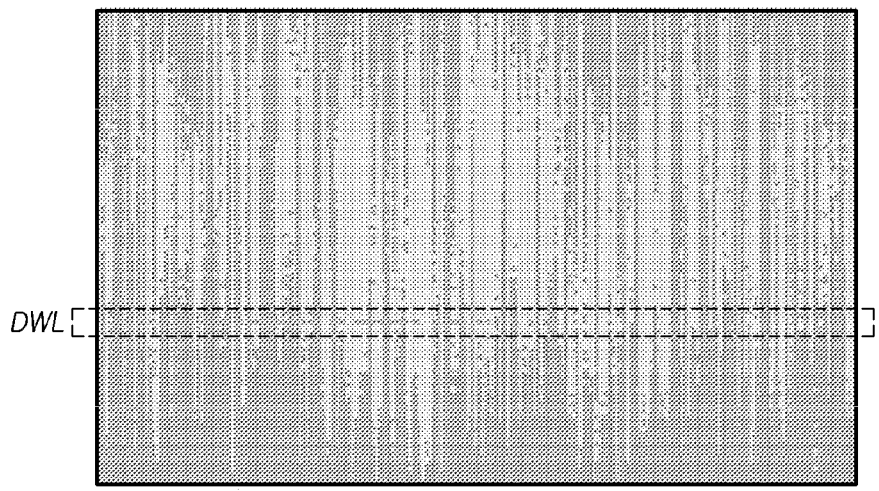
FIG. 7 illustrates a degraded word line according to an embodiment of the disclosed technology.

FIG. 7 is a diagram illustrating a degraded word line DWL according to an embodiment of the disclosed technology. In FIG. 7, the vertical axis corresponds to word lines, the horizontal axis to bit lines, and a gray dot indicates a failed bit at the intersection of a word line and a bit line.

The degraded word line DWL may occur in the form of multiple bit failures.

Bit flips may occur from various causes during a process in which the memory controller 120 performs word line verification. Some of the bit flips may occur even in cells connected to a word line which is not the degraded word line DWL, and may correspond to overkills.

A failure related to the degraded word line DWL occurs in the form of substantially more bit fails in a specific word line when compared to word lines adjacent to that specific word line. Accordingly, the degraded word line DWL in the vertical center of the dashed box in FIG. 7 has more gray dots (more failed bits) than the word lines immediately above and below it.

The memory controller 120 may determine the degraded word line DWL on the basis of the fail bit count FBC by applying a condition for detecting the degraded word line DWL to the plurality of word lines WL while excluding overkill-related failures.

FIG. 8 is a diagram illustrating degraded word line information DWL_INFO according to an embodiment of the disclosed technology.

The degraded word line information DWL_INFO may include an address ADD corresponding to a degraded word line DWL, a fail bit count FBC of the degraded word line DWL, and differences ΔFBC1 and ΔFBC2 between the fail bit count FBC of the degraded word line DWL and fail bit counts FBC of word lines adjacent to the degraded word line DWL.

The address ADD corresponding to the degraded word line DWL, included in the degraded word line information DWL_INFO, indicates the location of the degraded word line DWL in the memory cell array 210, and may be used later when the degraded word line DWL is replaced with a redundancy word line.

When the address ADD of the degraded word line DWL has a value X, the word lines WL adjacent to the degraded word line DWL are word lines WL corresponding to addresses X−1 and X+1.

The differences ΔFBC1 and ΔFBC2 between the fail bit count FBC of the degraded word line DWL and the fail bit counts FBC of the word lines adjacent to the degraded word line DWL are the difference between the fail bit count FBC of the word line whose address ADD corresponds to X−1 and the fail bit count FBC of the degraded word line DWL whose address ADD corresponds to X, and the difference between the fail bit count FBC of the word line WL whose address ADD corresponds to X+1 and the fail bit count FBC of the degraded word line DWL whose address ADD corresponds to X.

The differences ΔFBC1 and ΔFBC2 between the fail bit count FBC of the degraded word line DWL and the fail bit counts FBC of the adjacent word lines WL are parameters which indicate the performance of a word line WL corresponding to the degraded word line DWL, and may be used to determine the degraded word line DWL.

Figure 9:
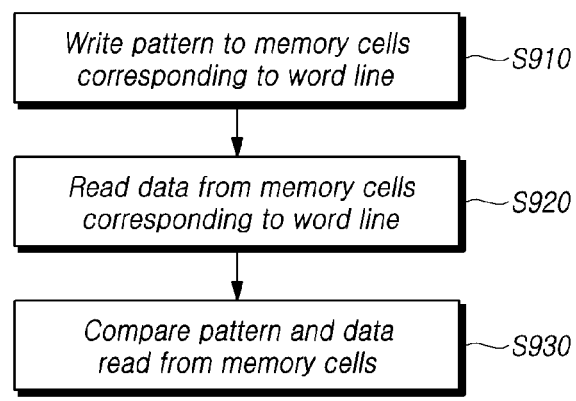
FIG. 9 is a flowchart illustrating a word line verify operation according to an embodiment of the disclosed technology.

FIG. 9 is a flowchart illustrating a word line verify operation according to an embodiment of the disclosed technology.

The word line verify operation of FIG. 9 may be included in step S410 of the process 400 of FIG. 4 of performing the word line verification, and may include a step S910 of writing a preset pattern to memory cells MC corresponding to a word line WL selected among the plurality of word lines WL, a step S920 of reading data from the memory cells MC corresponding to the selected word line WL, and a step S930 of comparing the preset pattern and the data read from the memory cells MC.

In order to perform the step S910 of writing the preset pattern, the memory controller 120 may write the preset pattern to the working memory 125. The preset pattern may be a predetermined pattern or a randomly generated pattern. The memory controller 120 may write the preset pattern, written to the working memory 125, to the selected word line WL.

After performing the step S910 of writing the preset pattern, the memory controller 120 may perform the step S920 of reading the data from the selected word line WL.

By comparing the preset pattern written to the working memory 125 and the data read from the memory cells MC corresponding to the selected word line WL, the memory controller 120 may check whether a bit flip has occurred in the memory cells MC corresponding to the selected word line WL and the plurality of bit lines BL.

FIG. 10 is a diagram illustrating a comparison between a preset pattern and data read from a word line according to an embodiment of the disclosed technology.

Referring to FIG. 10, the memory controller 120 may perform the step S930 of comparing a preset pattern PT and data RD read from the selected word line WL.

By comparing the preset pattern PT written to the working memory 125 and the data RD read from the memory cells MC corresponding to the selected word line WL, the memory controller 120 may check whether a bit flip F has occurred in each of the memory cells MC corresponding to the selected word line WL, to detect each of fail bits FB corresponding to the selected word line WL.

According to the illustration of FIG. 10, the pattern PT preset in the selected word line WL is expressed as 1100110011001100 in bits, and the data RD read from the memory cells MC corresponding to the selected word line WL is expressed as 1110110011000100 in bits.

By comparing the preset pattern PT and the data RD read from the memory cells MC, the memory controller 120 may check a bit flip F which is changed from 0 to 1 or is changed from 1 to 0. Fail bits FB indicate that bit flips F have occurred in the second and twelfth bits, counted from a most significant bit MSB that is the zero-th bit.

Figure 11:
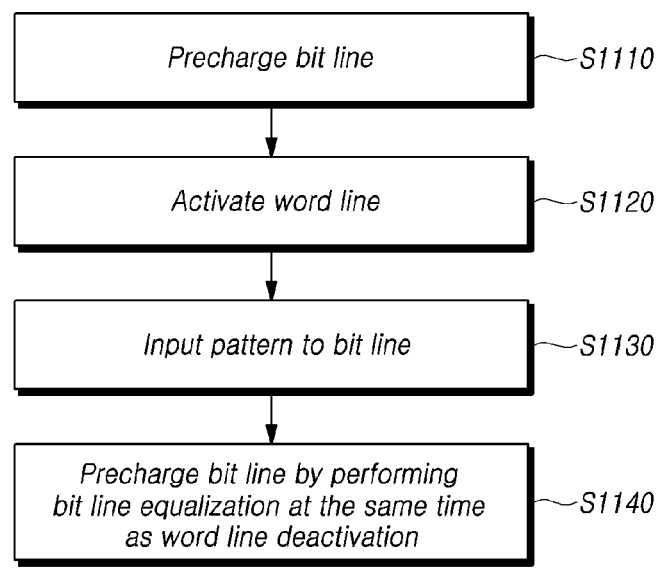
FIG. 11 is a flowchart illustrating an operation of writing a preset pattern in a memory cell array according to an embodiment of the disclosed technology.

FIG. 11 is a flowchart illustrating an operation of writing a preset pattern in a memory cell array according to an embodiment of the disclosed technology. The operation of FIG. 11 may be included in step S910 shown in FIG. 9 of writing the preset pattern.

Referring to FIG. 11, the operation may include a step S1110 of precharging the plurality of bit lines, a step S1120 of activating the selected word line WL, a step S1130 of inputting the preset pattern to the memory cells MC corresponding to the selected word line WL through the bit lines, and a step S1140 of precharging the plurality of bit lines by deactivating the selected word line WL and at the same time performing the bit line equalization.

The memory device 110 may perform the steps S1110 to S1140 on the basis of a command received from the memory controller 120.

Figure 12:
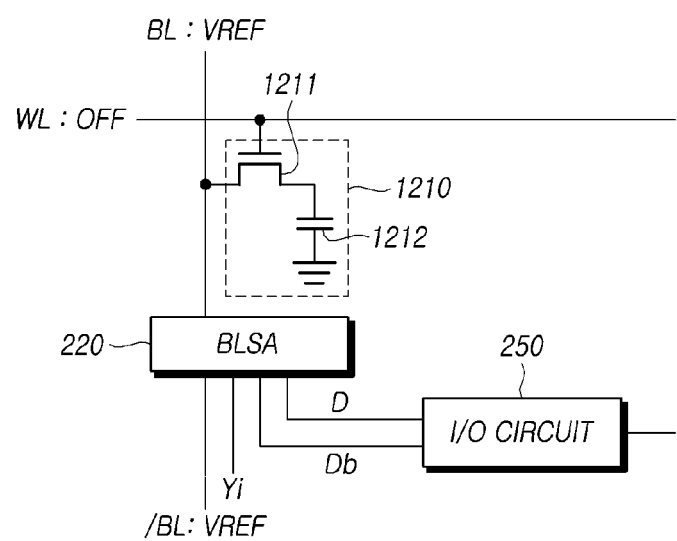
FIG. 12 illustrates a part of a memory cell array in which a bit line is precharged according to an embodiment of the disclosed technology.

FIG. 12 illustrates a part of a memory cell array in which a bit line is precharged according to an embodiment of the disclosed technology.

Figure 13:
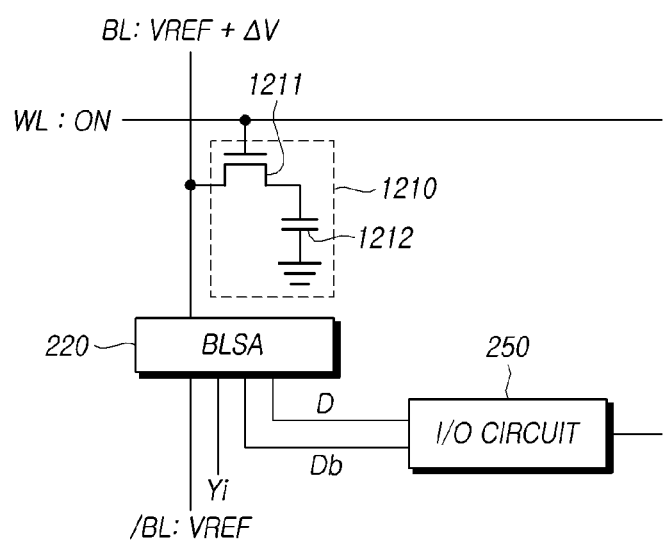
FIG. 13 illustrates a word line activation according to an embodiment of the disclosed technology.

FIG. 13 illustrates a word line activation according to an embodiment of the disclosed technology.

Figure 14:
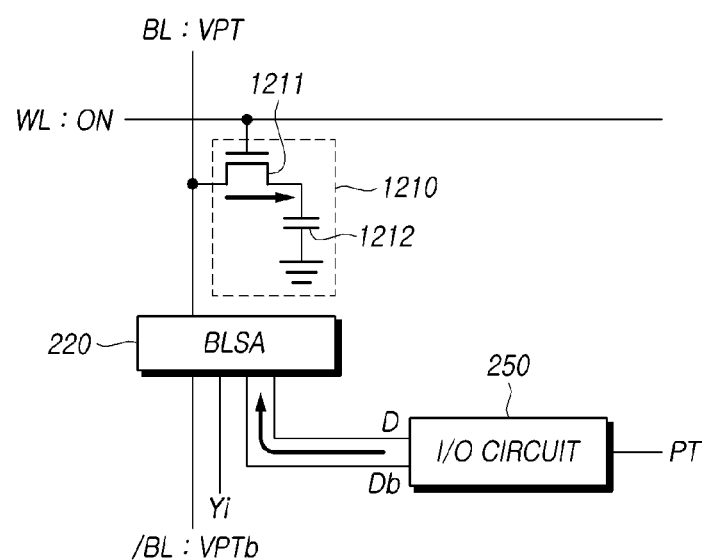
FIG. 14 illustrates an operation of inputting a pattern into a memory cell according to an embodiment of the disclosed technology.

FIG. 14 illustrates an operation of writing a pattern into a memory cell according to an embodiment of the disclosed technology.

Figure 15:
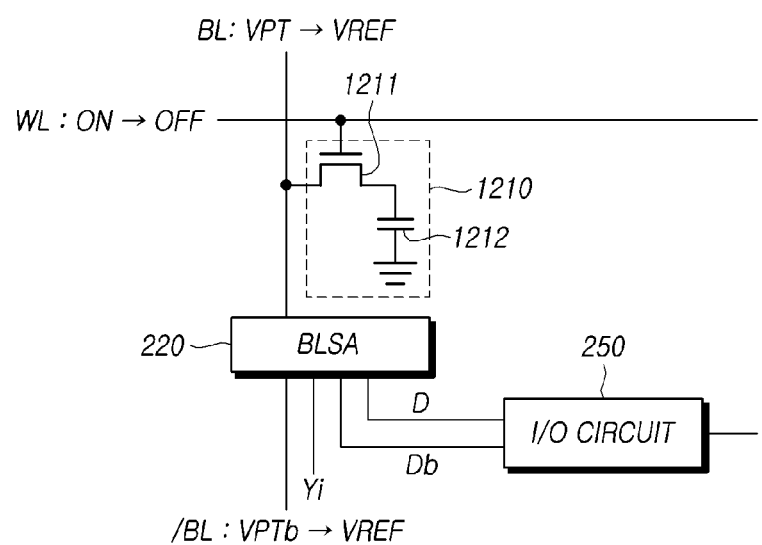
FIG. 15 illustrates a bit line precharge operation after a preset pattern is inputted according to an embodiment of the disclosed technology.

FIG. 15 illustrates a bit line precharge operation after a pattern is written according to an embodiment of the disclosed technology.

Referring to FIGS. 12 to 15, the memory device 110 may write the preset pattern PT to memory cells corresponding to the selected word line WL.

Each memory cell 1210 may include an access transistor 1211 and a cell capacitor 1212.

As illustrated in FIG. 12, at the step S1110 of precharging the plurality of bit lines, in a state in which the word line WL is deactivated (OFF), the bit line BL and the complementary bit line /BL may be precharged to a reference voltage VREF by a bit line precharge unit. At this time, the bit line sense amplifier 220 may be in a turned-off state.

Since the word line WL is in the deactivated (OFF) state, a channel is not formed in the access transistor 1211, and movement of electrical charge between the cell capacitor 1212 and the bit line BL is blocked.

As illustrated in FIG. 13, at the step S1120 of activating the selected word line WL, the selected word line WL may be activated by the sub word line driver 310. When the selected word line WL is activated (ON), a channel is formed between a drain and a source of the access transistor 1211. As a result, the movement of electrical charge between the cell capacitor 1212 and the bit line BL is enabled, and the voltage level of the bit line BL may be changed by charge sharing between the cell capacitor 1212 and the bit line BL.

The bit line sense amplifier 220 may amplify a changed level VREF+ΔV of the bit line BL.

As illustrated in FIG. 14, at the step S1130 of writing the preset pattern PT to the memory cells corresponding to the selected word line WL through the plurality of bit lines BL, the write driver (not illustrated) included in the input/output circuit 250 may apply a pattern level voltage VPT corresponding to a bit of the preset pattern PT, inputted from the memory controller 120, to the bit line BL.

As a result, the voltage level of the bit line BL changes to the pattern level voltage VPT, and the level of the cell capacitor 1212 also changes to the pattern level voltage VPT according to the voltage level of the bit line BL. Through this, the bit of the preset pattern PT may be stored in the memory cell MC.

As illustrated in FIG. 15, at the step S1140 of precharging the plurality of bit lines by deactivating the selected word line WL and at the same time performing the bit line equalization, at the same time as the word line WL is deactivated (OFF) by the sub word line driver 310, the level of the bit line BL may be changed from the pattern level VPT to the reference level VREF by the bit line precharge unit.

When the word line WL is normal, the channel in the access transistor 1211 unforms quickly enough that the data stored in the memory cell 1210 may be maintained. However, when the word line WL is degraded, the channel in the access transistor 1211 may not unform quickly enough, and as a result the change in the level of the bit line BL to the reference level VREF may affect the memory cell MC, and thus, multiple bit flips may occur in memory cells 1210 corresponding to the selected word line WL.

Figure 16:
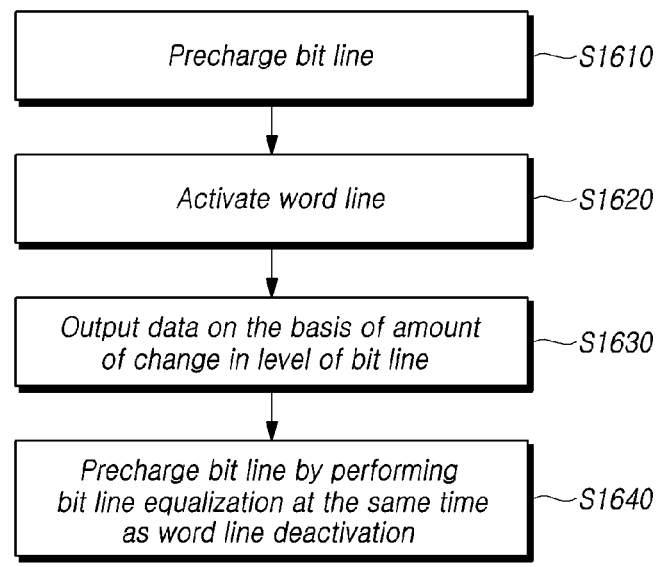
FIG. 16 is a flowchart illustrating an operation of reading data from a memory cell array according to an embodiment of the disclosed technology.

FIG. 16 is a flowchart illustrating an operation of reading data from a memory cell array according to an embodiment of the disclosed technology. The operation illustrated in FIG. 16 may be included in step S920 of reading data from the memory cells MC corresponding to the selected word line WL shown in FIG. 9.

Referring to FIG. 16, reading data from the memory cells MC corresponding to the selected word line WL in the memory array may include a step S1610 of precharging the plurality of bit lines, a step S1620 of activating the selected word line WL, a step S1630 of reading data stored in the memory cells MC corresponding to the selected word line WL on the basis of change amounts in the voltage levels of the plurality of bit lines, and a step S1640 of precharging the plurality of bit lines by deactivating the selected word line WL and at the same time performing bit line equalization.

The memory device 110 may perform the steps S1610 to S1640 on the basis of a command received from the memory controller 120.

Figure 17:
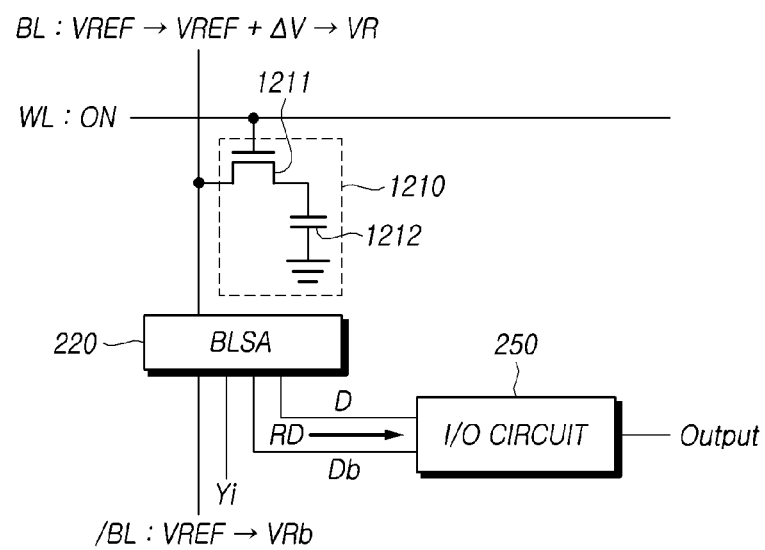
FIG. 17 illustrates an operation of outputting data stored in a memory cell according to an embodiment of the disclosed technology.

FIG. 17 illustrates an operation of reading data stored in a memory cell according to an embodiment of the disclosed technology.

Figure 18:
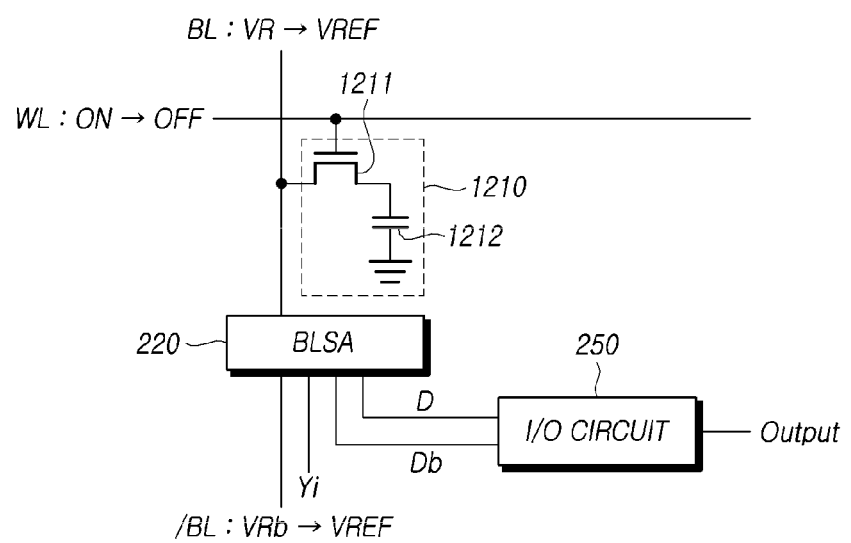
FIG. 18 illustrates a precharge operation after data is read according to an embodiment of the disclosed technology.

FIG. 18 illustrates a precharge operation after data is read according to an embodiment of the disclosed technology.

Referring to FIGS. 12, 13, 17 and 18, the memory device 110 may read data from the memory cells corresponding to the selected word line WL and output the read data to the outside of the memory device 110.

The step S1610 of precharging the plurality of bit lines and the step S1620 of activating the selected word line WL are the same as described above with reference to FIGS. 12 and 13.

At the step S1630 of reading data stored in the memory cells MC corresponding to the selected word line WL on the basis of change amounts in the voltage levels of the plurality of bit lines, the bit line sense amplifier 220 may amplify the level VREF+ΔV of the bit line BL changed at the step S1620 of activating the selected word line WL. In this case, the complementary bit line /BL may initially maintain the level of the reference voltage VREF, and the bit line sense amplifier 220 may compare the level of the reference voltage level VREF of the complementary bit line /BL and the level VREF+ΔV of the bit line BL. Thereafter, according to a comparison result, the bit line sense amplifier 220 may amplify the level of the bit line BL to VR and amplify the level of the complementary bit line /BL to VRb.

The bit line sense amplifier 220 may transmit the amplified level VR of the bit line BL to the input/output circuit 250 through input/output lines D and Db.

The input/output circuit 250 may amplify data through the input/output sense amplifier (not illustrated) and then output the amplified data to the outside of the memory device 110.

The data outputted to the outside of the memory device 110 may be used to identify a bit flip through comparison with the preset pattern PT.

As illustrated in FIG. 18, at the step S1640 of precharging the plurality of bit lines by deactivating the selected word line WL and at the same time performing the bit line equalization, at the same time as the word line WL is deactivated (OFF) by the sub word line driver 310, the level of the bit line BL and the level of the complementary bit line /BL may be changed by the bit line precharge unit from the levels VR and VRb produced by the bit line sense amplifier 220 to the reference level VREF.

With respect to the same word line WL, the step S1140 of precharging the plurality of bit lines by deactivating the selected word line WL and at the same time performing the bit line equalization, included in the step S910 of writing the preset pattern, and the step S1610 of precharging the plurality of bit lines, included in the step S920 of reading the data from the selected word line WL, may be the same process.

Accordingly, in an embodiment, after performing the step S1140 of precharging the plurality of bit lines by deactivating the selected word line WL and at the same time performing the bit line equalization in step S910, the memory device 110 in step S920 may perform the step S1620 of activating the selected word line WL, the step S1630 of outputting data on the basis of change amounts in the levels of the plurality of bit lines, and the step S1640 of precharging the plurality of bit lines by deactivating the selected word line WL and at the same time performing the bit line equalization.

Figure 19:
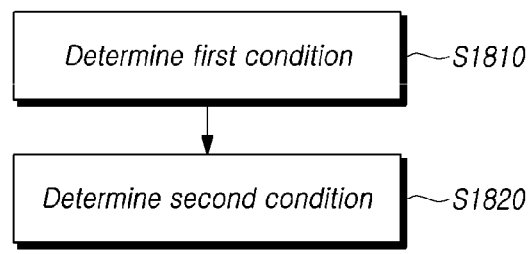
FIG. 19 is a flowchart for determining a degraded word line according to an embodiment of the disclosed technology.

FIG. 19 is a flowchart for determining a degraded word line according to an embodiment of the disclosed technology.

Referring to FIG. 19, in the process 400 for operating the memory system 100 shown in FIG. 4, the step S430 of determining a degraded word line may include a step S1910 of determining a first condition that is satisfied when the fail bit count of a word line selected among a plurality of word lines is larger than a first threshold count and a step S1920 of determining a second condition that is satisfied when the fail bit count of the selected word line is larger than the sum of a second threshold count and a maximum fail bit count between fail bit counts of word lines adjacent to the selected word line.

As described above, the performing of the word line verification by deactivating a word line WL and by at the same time performing the bit line equalization is also an overkill condition that may cause a bit flip even when a word line is not degraded.

Therefore, in order to determine a degraded word line, a condition for a threshold and a condition for excluding bit flips that are probably due to overkill are required.

The first condition is a condition related with a threshold for determining a degraded word line, and the second condition is a condition for excluding a word line where overkill was likely to have occurred, such as a word line at the top end or bottom end of the memory cell array 210. The memory controller 120 may determine a word line which satisfies both the first condition and the second condition, as being a degraded word line.

Figure 20:
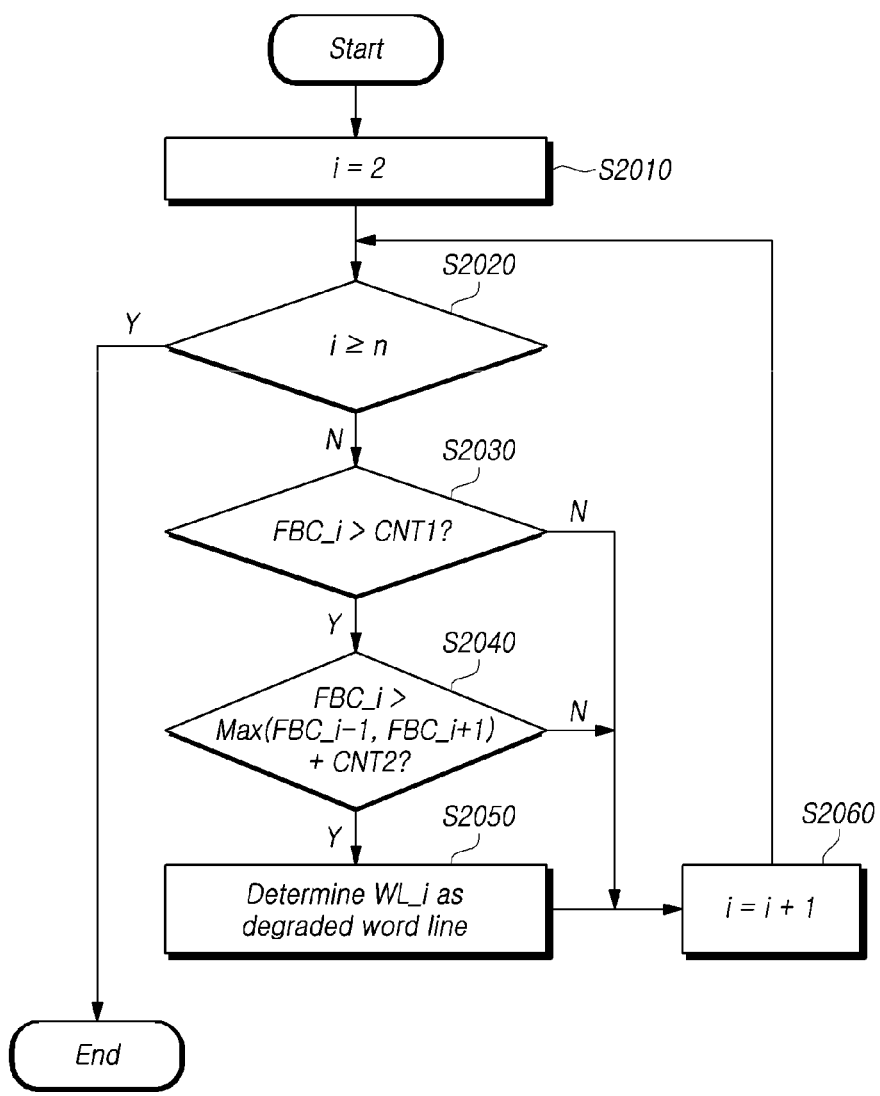
FIG. 20 is a flowchart illustrating an operation of determining a degraded word line according to an embodiment of the disclosed technology.

FIG. 20 is a flowchart illustrating an operation of determining a degraded word line according to an embodiment of the disclosed technology.

Referring to FIG. 20, the memory controller 120 may determine a degraded word line on the basis of the fail bit count of each of a plurality of word lines.

It is assumed that n number of word lines WL_1 to WL_n exist in the memory cell array 210, fail bit counts FBC_1 to FBC_n corresponding to the n number of word lines WL_1 to WL_n, respectively, are counted and addresses corresponding to the n number of word lines WL_1 to WL_n are 1 to n, respectively.

The memory controller 120 may set the initial value of i to 2 (S2010). The reason for this is that, since each of a first word line WL1 and an n-th word line WL_n which are outermost word lines has only one adjacent word line, it cannot be determined whether a second condition to be described later is satisfied.

The memory controller 120 may determine whether i is equal to or greater than n being the total number of rows (S2020). When i is equal to or greater than n (S2020—Y), the memory controller 120 may end the determination of degraded word lines.

When i is not equal to or greater than n (S2020—N), the memory controller 120 may determine whether a fail bit count FBC_i of an i-th word line WL_i corresponding to an address i is larger than a first threshold count CNT1 (S2030).

The step S2030 corresponds to the step S1910 of determining the first condition, and corresponds to a condition related with a threshold for determining a degraded word line.

The first threshold count CNT1 may be set to, for example, one-half of the total number of bit lines BL intersecting with the word line being evaluated in the memory cell array 210. For example, when 1024 bit lines intersect with the word lines in the memory cell array 210, the first threshold count CNT1 may be set to 512.

When the fail bit count FBC_i of the i-th word line WL_i is not larger than the first threshold count CNT1 (S2030—N), the memory controller 120 may increase i by 1 to determine whether a next word line WL satisfies the first condition and the second condition (S2060).

When the fail bit count FBC_i of the i-th word line WL_i is larger than the first threshold count CNT1 (S2030—Y), the memory controller 120 may determine whether the fail bit count FBC_i of the i-th word line WL_i is larger than the sum of a second threshold count CNT2 and a maximum fail bit count Max(FBC_i−1, FBC_i+1) between fail bit counts FBC_i−1 and FBC_i+1 of word lines adjacent to the i-th word line WL_i, that is, an (i−1)-th word line WL_i−1 and an (i+1)-th word line WL_i+1 (S2040).

The step S2040 corresponds to the step S1920 of determining the second condition, and the memory controller 120 may exclude, through the second condition, an overkill likely to occur at the top end or bottom end of the memory cell array 210. In order to satisfy the second condition, the fail bit count FBC_i of the i-th word line WL_i should be larger by the second threshold count CNT2 compared to the adjacent word lines WL_i−1 and WL_i+1. Therefore, the memory controller 120 may detect multiple bit flips caused by a degraded word line through the second condition.

When the fail bit count FBC_i of the i-th word line WL_i is larger than the sum of the second threshold count CNT2 and the maximum fail bit count Max(FBC_i−1, FBC_i+1) between the fail bit counts FBC_i−1 and FBC_i+1 of the word lines WL_i−1 and WL_i+1 adjacent to the i-th word line WL_i (S2040—Y), the memory controller 120 may determine the i-th word line WL_i as a degraded word line (S2050). On the other hand, when the fail bit count FBC_i of the i-th word line WL_i is not larger than the sum of the maximum fail bit count Max(FBC_i−1, FBC_i+1) between the fail bit counts FBC_i−1 and FBC_i+1 of the word lines WL_i−1 and WL_i+1 adjacent to the i-th word line WL_i and the second threshold count CNT2 (S2040—N), the memory controller 120 may increase i by 1 to determine whether a next word line WL satisfies the first condition and the second condition (S2060).

Through this, the memory controller 120 may determine whether each of the n number of word lines WL1 to WLn (except, in some embodiments, the first and nth word lines) is a degraded word line.

FIG. 21 illustrates determining whether respective word lines satisfy a first condition and a second condition according to an embodiment of the disclosed technology.

Referring to FIG. 21, the memory controller 120 may determine a degraded word line through the step S1910 of determining the first condition 1ST CONDITION and the step S1920 of determining the second condition 2ND CONDITION for each of the plurality of word lines WL_1 to WL_16. In FIG. 21, an "O" indicates that a word line satisfied a condition, an "X" indicates that a word line did not satisfy the condition, and an dash indicates that whether the word line satisfied the condition may not have been determined.

Since the second word line WL_2, the third word line WL_3, the eleventh word line WL_11 and the thirteenth word line WL_13 to the fifteenth word line WL_15 have fail bit counts FBC larger than the first threshold count CNT1 of 8, they correspond to word lines WL which satisfying the first condition 1ST CONDITION.

The memory controller 120 may determine whether the word lines WL which satisfy the first condition 1ST CONDITION satisfy the second condition 2ND CONDITION.

A fail bit count FBC_11 of the eleventh word line WL_11 is 13, and word lines WL adjacent to the eleventh word line WL_11 are the tenth word line WL_10 and the twelfth word line WL_12. A fail bit count FBC_10 of the tenth word line WL_10 is 6, and a fail bit count FBC_12 of the twelfth word line WL_12 is 8.

Therefore, since the second threshold count CNT2 is 4, a maximum fail bit count Max(FBC_10, FBC_12) between the fail bit count FBC_10 of the tenth word line WL_10 (which is 6) and the fail bit count FBC_12 of the twelfth word line WL_12 (which is 8) is 8, and the fail bit count FBC_11 of the eleventh word line WL_11 (which is 13) is larger than the sum of the maximum fail bit count Max(FBC_10, FBC_12) of 8 and the second threshold count CNT2 of 4, the eleventh word line WL_11 may be determined as a degraded word line.

Since the second word line WL_2, the third word line WL_3 and the thirteenth word line WL_13 to the fifteenth word line WL_15 do not satisfy the second condition 2ND CONDITION even though they satisfy the first condition 1ST CONDITION, they may not be respectively determined as degraded word lines.

The memory controller 120 may output the degraded word line information DWL_INFO of the eleventh word line WL_11 being a degraded word line, to the outside of the memory system 100. Also, the memory controller 120 may store the degraded word line information DWL_INFO of the eleventh word line WL_11 in the second memory device 130.

Thereafter, the eleventh word line WL_11 may be replaced with a redundancy word line on the basis of the degraded word line information DWL_INFO outputted from the memory controller 120 or the degraded word line information DWL_INFO stored in the second memory device 130.

FIG. 22 illustrates another example of determining a degraded word line according to an embodiment of the disclosed technology.

Referring to FIG. 22, when at least first and second word lines exist as word lines which satisfy the first condition and the second condition, the fail bit count of the first word line is larger than the fail bit count of the second word line, and the difference between a maximum fail bit count between the fail bit counts of word lines adjacent to the first word line and the fail bit count of the first word line is larger than the difference between a maximum fail bit count between the fail bit counts of word lines adjacent to the second word line and the fail bit count of the second word line, the memory controller 120 may determine the second word line as being the degraded word line.

According to the illustration of FIG. 22, the eighth word line WL_8 and the eleventh word line WL_11 are word lines which satisfy the first condition 1ST CONDITION and the second condition 2ND CONDITION. Since the fail bit count FBC_8 of the eighth word line WL_8 is 14 and the fail bit count FBC_11 of the eleventh word line WL_11 is 13, the fail bit count FBC_8 of the eighth word line WL_8 is larger than the fail bit count FBC_11 of the eleventh word line WL_11.

Since the difference between a maximum value (here, 4) between the fail bit counts FBC_7 and FBC_9 of the seventh and ninth word lines WL_7 and WL_9 adjacent to the eighth word line WL_8 and the fail bit count FBC_8 of the eighth word line WL_8 is 10, and the difference between a maximum value (here, 8) between the fail bit counts FBC_10 and FBC_12 of the tenth and twelfth word lines WL_10 and WL_12 adjacent to the eleventh word line WL_11 and the fail bit count FBC_11 of the eleventh word line WL_11 is 5, the memory controller 120 may determine the eighth word line WL_8 as a degraded word line.

Figure 23:
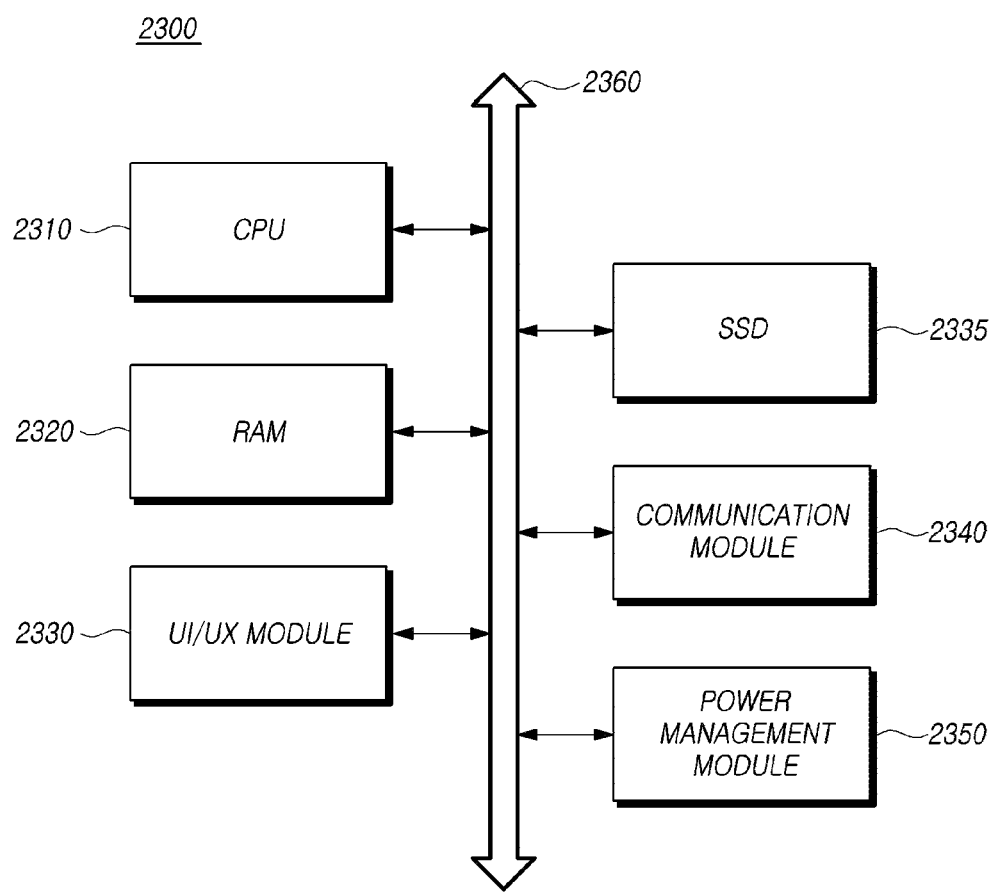
FIG. 23 illustrates a configuration of a computing system according to some embodiments of the disclosed technology.

FIG. 23 illustrates a configuration of a computing system 2300 according to an embodiment of the disclosed technology.

The computing system 2300 may include: a storage system 2335 (in the figure, solid state drive (SSD)) electrically connected to a system bus 2360; a CPU 2310 configured to control the overall operation of the computing system 2300; a RAM 2320 configured to store data and information related to operations of the computing system 2300; a user interface/user experience (UI/UX) module 2330 configured to provide the user with a user environment; a communication module 2340 configured to communicate with an external device as a wired and/or wireless type; and a power management module 2350 configured to manage power used by the computing system 2300.

The computing system 2300 may be a personal computer (PC) or may include a mobile terminal such as a smartphone, a tablet or various electronic devices.

The computing system 2300 may further include a battery for supplying an operating voltage, and may further include an application chipset, a graphic-related module, a camera image processor, and a DRAM. Other elements would be obvious to a person skilled in the art.

The storage system 2335 may include not only a device configured to store data in a nonvolatile memory such as an SSD, a universal flash storage device, or an embedded MMC (eMMC) device, but in the alternative or in addition, may include a device configured to store data in a magnetic media such as a hard disk drive (HDD). The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the storage system 2335 may be implemented as storage devices of various types and mounted inside various electronic devices.

The RAM 2320, the storage system 2335, or both may include respective memory systems according to an embodiment, such as the memory system 100 shown in FIG. 1.

According to embodiments of the disclosed technology described above, the quality, reliability, and service life of a memory system may be improved. Although various embodiments of the disclosed technology have been described with particular specifics and varying details for illustrative purposes, those skilled in the art will appreciate that various modifications, additions and substitutions may be made according to what is disclosed or illustrated in this patent document.

What is claimed is:

1. A method for operating a memory system, comprising:
performing, in a memory cell array in which a plurality of word lines and a plurality of bit lines intersect with each other, a word line verification by deactivating each of the plurality of word lines and at the same time performing a bit line equalization;
determining a fail bit count for each of the plurality of word lines according to a number of bit flips that occurred in memory cells corresponding with that word line during the word line verification; and
determining a degraded word line on the basis of fail bit counts of the plurality of word lines,
wherein determining the degraded word line comprises:
determining whether a second word line selected from among the plurality of word lines satisfies a first condition, the first condition being satisfied for a word line when a fail bit count of that word line is larger than a first threshold count;
determining whether the second word line satisfies a second condition, the second condition being satisfied for a word line when the fail bit count of that word line is larger than a sum of a second threshold count and a maximum fail bit count between fail bit counts of word lines adjacent to that word line; and
determining whether the second word line is the degraded word according to whether the second word line satisfies both the first and second condition.

2. The method according to claim 1, further comprising:
outputting degraded word line information including an address of the degraded word line, a fail bit count of the degraded word line and a difference between the fail bit count of the degraded word line and a fail bit count of each of one or more word lines adjacent to the degraded word line.

3. The method according to claim 1, wherein the performing of the word line verification comprises:
writing a preset pattern to memory cells corresponding to a first word line selected among the plurality of word lines;
reading data from the memory cells corresponding to the first word line; and
comparing the preset pattern and the data read from the memory cells.

4. The method according to claim 3, wherein the writing of the preset pattern comprises:
precharging the plurality of bit lines;
activating the first word line;
inputting the preset pattern to the memory cells, corresponding to the first word line, through the plurality of bit lines; and
precharging the plurality of bit lines by deactivating the first word line and at the same time performing the bit line equalization.

5. The method according to claim 3, wherein the reading of the data from the memory cells comprises:
precharging the plurality of bit lines;
activating the first word line;
outputting data stored in the memory cells corresponding to the first word line on the basis of change amounts in levels of the plurality of bit lines; and
precharging the plurality of bit lines by deactivating the first word line and at the same time performing the bit line equalization.

6. The method according to claim 1, wherein the first threshold count is one-half of the number of bit lines which intersect with the second word line.

7. The method according to claim 1, wherein the second threshold count is one-fourth of the number of bit lines which intersect with the second word line.

8. The method according to claim 1, wherein, when the second word line and a third word line selected from among the plurality of word lines both satisfy the first condition and the second condition, a fail bit count of the second word line is larger than a fail bit count of the third word line and a difference between a maximum fail bit count between fail bit counts of word lines adjacent to the second word line and the fail bit count of the second word line is larger than a difference between a maximum fail bit count between fail bit counts of word lines adjacent to the third word line and the fail bit count of the third word line, the second word line is determined as the degraded word line.

9. A memory system comprising:
a memory device including a plurality of word lines, a plurality of bit lines, and a memory cell array in which the plurality of word lines and the plurality of bit lines intersect with each other; and
a memory controller configured to:
perform a word line verification on each of the plurality of word lines by deactivating each of the plurality of word lines and at the same time performing a bit line equalization,
determine a fail bit count for each of the plurality of word lines according to a number of bit flips that occurred in memory cells corresponding with that word line during the word line verification, and
determine a degraded word line on the basis of fail bit counts of the plurality of word lines,
wherein the memory controller determining the degraded word line comprises:
determining whether a second word line selected from among the plurality of word lines satisfies a first condition, the first condition being satisfied for a word line when a fail bit count of that word line is larger than a first threshold count;
determining whether the second word line satisfies a second condition, the second condition being satisfied for a word line when the fail bit count of that word line is larger than a sum of a second threshold count and a maximum fail bit count between fail bit counts of word lines adjacent to that word line; and
determining whether the second word line is the degraded word according to whether the second word line satisfies both the first and second condition.

10. The memory system according to claim 9, wherein the memory controller outputs degraded word line information including an address of the degraded word line, a fail bit count of the degraded word line and a difference between the fail bit count of the degraded word line and a fail bit count of each of one or more word lines adjacent to the degraded word line, on the basis of determination of the degraded word line.

11. The memory system according to claim 9, wherein the memory controller writes a preset pattern to memory cells corresponding to a first word line selected among the plurality of word lines, reads data from the memory cells corresponding to the first word line, and compares the preset pattern and the data read from the memory cells.

12. The memory system according to claim 11, wherein the memory device precharges the plurality of bit lines, activates the first word line, inputs the preset pattern to the memory cells corresponding to the first word line through the plurality of bit lines, and precharges the plurality of bit lines by deactivating the first word line and at the same time performing the bit line equalization.

13. The memory system according to claim 11, wherein the memory device precharges the plurality of bit lines, activates the first word line, outputs data stored in the memory cells corresponding to the first word line on the basis of change amounts in levels of the plurality of bit lines, and precharges the plurality of bit lines by deactivating the first word line and at the same time performing the bit line equalization.

14. The memory system according to claim 9, wherein the first threshold count is one-half of the number of bit lines which intersect with the second word line.

15. The memory system according to claim 9, wherein the second threshold count is one-quarter of the number of bit lines which intersect with the second word line.

16. The memory system according to claim 9, wherein, when the second word line and a third word line selected from among the plurality of word lines both satisfy the first condition and the second condition, a fail bit count of the second word line is larger than a fail bit count of the third word line and a difference between a maximum fail bit count between fail bit counts of word lines adjacent to the second word line and the fail bit count of the second word line is larger than a difference between a maximum fail bit count between fail bit counts of word lines adjacent to the third word line and the fail bit count of the third word line, the memory controller determines the second word line as a degraded word line.

\* \* \* \* \*